United States Patent [19]

Kim

[11] Patent Number: 5,391,521
[45] Date of Patent: Feb. 21, 1995

[54] METHOD FOR FABRICATING LOW RESISTANCE CONTACTS OF SEMICONDUCTOR DEVICE

[75] Inventor: Sang Y. Kim, Kyoungki-do, Rep. of Korea

[73] Assignee: Hyundai Electronics Industries Co., Ltd., Rep. of Korea

[21] Appl. No.: 173,552

[22] Filed: Dec. 27, 1993

[30] Foreign Application Priority Data

Dec. 30, 1992 [KR] Rep. of Korea ............... 1992-26723

[51] Int. Cl.$^6$ ........................................... H01L 21/283
[52] U.S. Cl. .................... 437/200; 437/192; 437/195; 437/201; 748/DIG. 19
[58] Field of Search ............... 437/201, 200, 187, 189, 437/193, 195, 190, 192; 748/DIG. 19, DIG. 147; 257/763, 769, 757, 770

[56] References Cited

U.S. PATENT DOCUMENTS 5,234,863  8/1993  Hosaka .............................. 437/193

FOREIGN PATENT DOCUMENTS 1-268150 10/1989 Japan ............................ 148/DIG. 19
2-123740  5/1990 Japan ..................................... 437/190
4-349660 12/1992 Japan .

OTHER PUBLICATIONS

Wolf, S., Silicon Processing, Lattice Press, vol. II, 1990, pp. 84–94, 127–129, 144–150.

Primary Examiner—T. N. Quach
Attorney, Agent, or Firm—Merchant, Gould, Smith, Edell, Welter & Schmidt

[57] ABSTRACT

A method for fabricating contacts of a semiconductor device capable of achieving a reduced contact resistance by using a material, such as TiSi$_2$, exhibiting a low potential barrier to a N+ diffusion layer for a contact for the N+ diffusion layer and a material, such as PtSi, exhibiting a low potential barrier to a P+ diffusion layer for a contact for the P+ diffusion layer and performing two independent masking works respectively for the N+ diffusion layer and the P+ diffusion layer.

3 Claims, 3 Drawing Sheets

METHOD FOR FABRICATING LOW RESISTANCE CONTACTS OF SEMICONDUCTOR DEVICE

BACKGROUND OF THE INVENTION

1. Field of the Invention

The present invention relates to a method for fabricating a highly integrated semiconductor device, and more particularly to a method for fabricating contacts of a semiconductor device capable of achieving a reduction in contact resistance.

2. Description of the Prior Art

As techniques have been developed to fabricate highly integrated semiconductor devices having microstructures, parasitic resistance generated in metal wiring structures has been highlighted as an important problem. Such a parasitic resistance results mainly from an increase in contact resistance between the metal wiring and diffusion layer. In the fabrication of general metal oxide semiconductor (MOS) devices, an ohmic contact should be provided between the metal layer and semiconductor layer. For realizing such an ohmic contact, impurity ions are present in high concentration on the surface of the semiconductor layer being in contact with the metal layer so that current flow between the metal layer and the semiconductor layer can mainly be achieved by tunneling current through the potential barrier.

Where the current component present at the contact between the metal layer and the semiconductor layer is mainly based on the tunneling, its current density can be expressed as follows:

$$J_t \sim \exp(-8\Phi_B/E_{OO}) \quad (1)$$

wherein, $E_{OO}$: $g\lambda/2$ $(N_D/\epsilon_S M^*)$
$\epsilon_S$: dielectric constant of silicon
$m^*$: effective electron mass
$\lambda$: decreased Flanck's constant
$N_D$: impurity concentration In this case, a particular contact resistance can be expressed as follows:

$$R_c \sim \exp(-8 \Phi_B/E_{00}) \quad (2)$$
$$\cong \exp\left(\frac{2\epsilon_S m^*}{\lambda} \cdot \frac{\Phi_B}{N_D}\right)$$

By referring to equation (2), it can be found that the particular contact resistance is exponentially varied depending on variations in doping concentration and potential barrier.

In other words, a decrease in contact resistance can be achieved by increasing the concentration of impurities activated in the surface of the semiconductor layer and using a material exhibiting a low potential barrier as the contact metal layer.

However, there is a limitation on the increase in concentration of impurities activated in the semiconductor surface. Using a material exhibiting a low potential barrier as the contact metal layer, there is a limitation that one metal is used for both metal layers respectively being in contact with a N+ diffusion layer and a P+ diffusion layer. This is because potential barriers defined by the metal layers respectively being in contact with the N+ diffusion layer and the P+ diffusion layer are different. In a case of PtSi, it defines a low potential barrier of 0.26 together with the P+ diffusion layer and a high potential barrier of 0.84 together with the N+ diffusion layer.

SUMMARY OF THE INVENTION

Therefore, an object of the invention is to provide a method for fabricating contacts of a semiconductor device capable of achieving a reduced contact resistance by using a material, such as Ti or TiSi$_2$, exhibiting a low potential barrier to a N+ diffusion layer as a contact for the N+ diffusion layer and a material, such as PtSi, exhibiting a low potential barrier to a P+ diffusion layer as a contact for the P+ diffusion layer and performing two independent masking works respectively for the N+ diffusion layer and the P+ diffusion layer.

In accordance with the present invention, different metals are used for a contact for the N+ diffusion layer and a contact for the P+ diffusion layer, respectively. A material exhibiting a low potential barrier to the N+ diffusion layer is used for a contact for the P+ diffusion layer whereas a material exhibiting a low potential barrier to the P+ diffusion layer for a contact for the P+ diffusion layer. In accordance with the present invention, two independent masking works are performed for the N+ diffusion layer and the P+ diffusion layer, respectively. In conventional methods, contact holes for the N+ diffusion layer and the P+ diffusion layer are simultaneously formed by use of a single masking work.

In accordance with the present invention, the above-mentioned object can be accomplished by providing a method for fabricating contacts of a semiconductor device, comprising the steps of: forming a contact hole for a N+ diffusion layer contact by a first masking work and then depositing a metal layer for the N+ diffusion layer contact; forming a contact hole for a P+ diffusion layer contact by a second masking work and then depositing a metal layer for the P+ diffusion layer contact; and forming a metal wiring.

BRIEF DESCRIPTION OF THE DRAWINGS other objects and aspects of the invention will become apparent from the following description of embodiments with reference to the accompanying drawings in which:

FIGS. 1A to 1I are sectional views respectively illustrating a method for fabricating contacts of a semiconductor device.

DETAILED DESCRIPTION OF THE PREFERRED EMBODIMENTS

FIGS. 1A, 1B, 1C, 1D, 1E, 1F, 1G, 1H and 1I are sectional views respectively illustrating a method for fabricating contacts of a semiconductor device in accordance with the present invention.

Figure 1A:
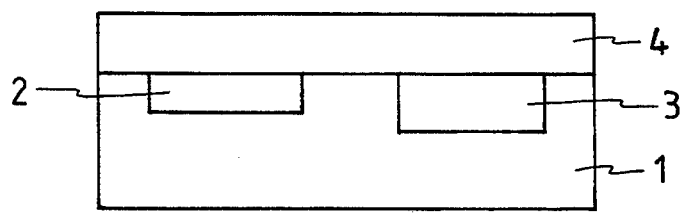

In accordance with this method, on a silicon substrate 1 a N+ diffusion layer 2 and a P+ diffusion layer 3 are formed, as shown in FIG. 1A. Thereafter, an inter-layer insulating film 4 for a metal wiring is deposited over the entire exposed surface of the resulting structure. The formation steps of the N+ diffusion layer 2 and the P+ diffusion layer 3 and the insulating film 4 are carried out by use of well-known processes and, thus, their detailed description will be omitted.

Figure 1B:
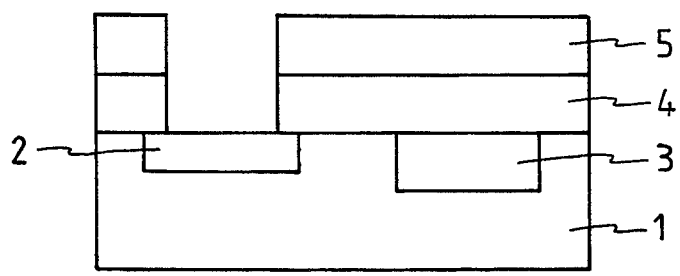

For forming a contact hole over the N+ diffusion layer 2, a photoresist film 5 is deposited over the entire exposed surface of the resulting structure and then patterned by a masking work, as shown in FIG. 1B. Using the patterned photoresist film 5 as a mask, a dry etching is performed, thereby forming a contact hole disposed only over the N+ diffusion layer 2.

Figure 1C:
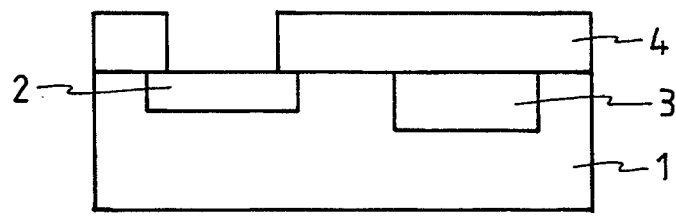

Subsequently, the photoresist film 5 is removed, as shown in FIG. 1C. Thus a contact hole for a metal wiring of the N+ diffusion layer is obtained.

Figure 1D:
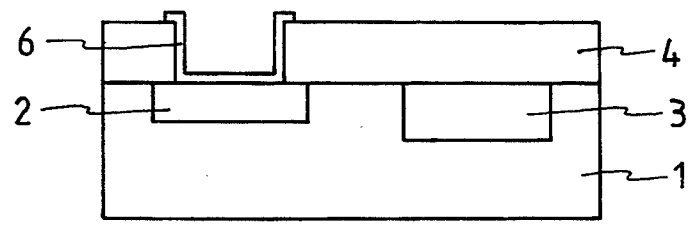

Over the contact hole for the N+ diffusion layer, a material such as Ti or TiSi$_2$ exhibiting a low potential barrier to silicon of the N+ diffusion layer is deposited to form a N+ diffusion layer contact metal layer 6, as shown in FIG. 1D. This contact metal layer 6 is then patterned by masking work.

Figure 1E:
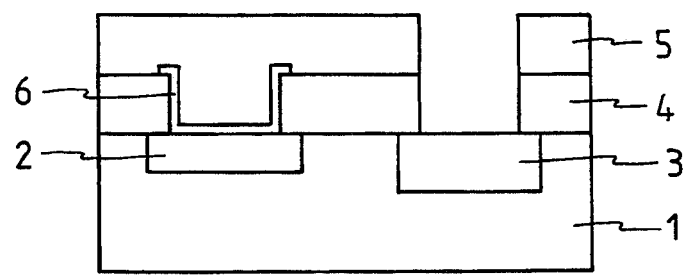
Figure 1F:
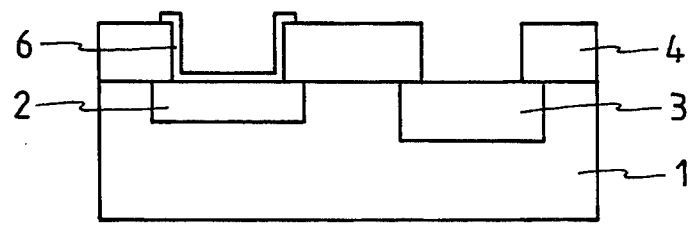

For forming a contact hole over the P+ diffusion layer 3, another photoresist film S is deposited over the entire exposed surface of the resulting structure and then patterned by masking work, as shown in FIG. 1E. Using the patterned photoresist film 5 as a mask, a dry etching is performed, thereby forming a contact hole disposed only over the P+ diffusion layer 3.

Subsequently, the photoresist film 5 is removed so as to expose the patterned contact metal layer 6 formed at the contact hole for the N+ diffusion layer, as shown in FIG. IF. Thus a contact hole for the P+ diffusion layer is obtained.

Figure 1G:
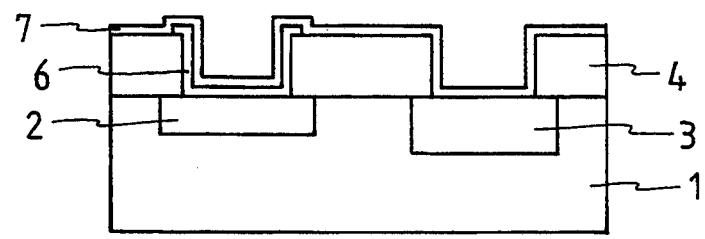

Over the entire exposed surface of the resulting structure including the contact hole for the P+ diffusion layer and the patterned contact metal layer 6 of the contact hole for the N+ diffusion layer, a material such as PtSi exhibiting a low potential barrier to silicon of the P+ diffusion layer is deposited to form a P+ diffusion layer contact metal layer 7, as shown in FIG. 1G.

Figure 1H:
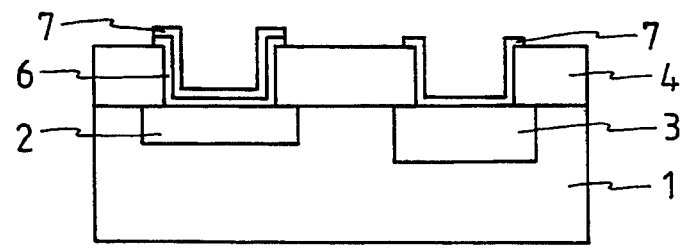

Contact metal layer 7 is then patterned by masking work, as shown in FIG. 1H. Although both the contact metal layer 6 for the N+ diffusion layer and the contact metal layer 7 for the diffusion layer are disposed in the contact hole for the N+ diffusion layer to be in contact with each other, the contact between these two metal layers scarcely affects the contact resistance as it is inter-metal contact.

Figure 1I:
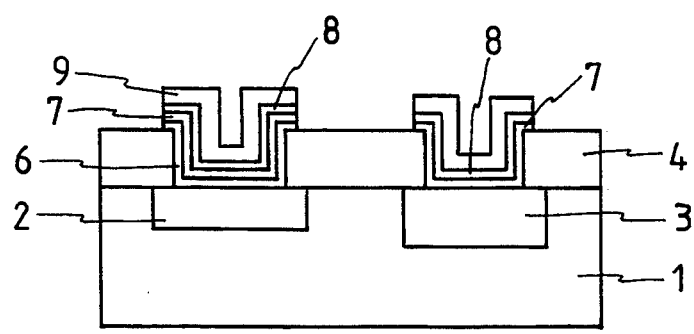

Over both contacts provided by the contact metal layer 6 for the N+ diffusion layer and the contact metal layer 7 for the P+ diffusion layer, a diffusion barrier metal layer 8 and a metal wiring 9 are deposited and then patterned by masking work, as shown in FIG. 1I. Thus, a formation of a metal wiring is completed.

As apparent from the above description, the present invention provides a method for fabricating contacts of a semiconductor device capable of achieving a reduced contact resistance by using a material, such as TiSi$_2$, exhibiting a low potential barrier to a N+ diffusion layer for a contact for the N+ diffusion layer and a material, such as PtSi, exhibiting a low potential barrier to a P+ diffusion layer for a contact for the P+ diffusion layer and performing two independent masking works respectively for the N+ diffusion layer and the P+ diffusion layer.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating contacts of a highly integrated semiconductor device, comprising the steps of:
   forming a N+ diffusion layer and a P+ diffusion layer on a silicon substrate;
   depositing an inter-layer insulating film over the N+ and P+ diffusion layers, coating a first photoresist film over said insulating film, and forming a first contact hole over said N+ diffusion layer by use of a masking process and an etching process;
   removing the remaining first photoresist film;
   depositing a first contact layer made of a first metal silicide exhibiting a low potential barrier to the N+ diffusion layer over said first contact hole for the N+ diffusion layer, and forming a pattern of said first contact layer for the N+ diffusion layer by use of a masking process;
   coating a second photoresist film over the first contact layer and the insulating film, and forming a second contact hole over said P+ diffusion layer by use of a masking process and an etching process;
   removing the remaining second photoresist film;
   depositing a second contact layer made of a second metal silicide exhibiting a low potential barrier to the P+ diffusion layer and over said first contact hole for the N+ diffusion layer, and forming a pattern of said second contact layer for the P+ diffusion layer and the N+ diffusion layer by use of a masking process; and
   sequentially depositing a diffusion barrier metal layer and a metal wiring layer over said first and second contact layers and the insulating film, and forming a metal wiring by use of a masking process.

2. A method in accordance with claim 1, wherein said metal silicide of the first contact layer for the N+ diffusion layer is TiSi$_2$.

3. A method in accordance with claim 1, wherein said metal silicide of the second contact layer for the P+ diffusion layer is PtSi.

* * * * *